(12) United States Patent
Wang et al.

(10) Patent No.: US 6,363,005 B1
(45) Date of Patent: Mar. 26, 2002

(54) METHOD OF INCREASING OPERATING SPEED OF SRAM

(75) Inventors: Cheng-Lieh Wang, Taoyuan; Cheng-Nan Lin, Taichung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/801,349

(22) Filed: Mar. 7, 2001

(51) Int. Cl.$^7$ .............................................. G11C 11/40
(52) U.S. Cl. ...................................... 365/154; 365/156
(58) Field of Search ................................ 365/154, 156; 257/369, 903, 904

(56) References Cited

U.S. PATENT DOCUMENTS 5,732,015 A * 3/1998 Kazerounian et al. ...... 365/154
6,044,011 A * 3/2000 Marr et al. .................. 365/154
6,172,899 B1 * 1/2001 Marr et al. .................. 365/154

\* cited by examiner

*Primary Examiner*—Son Mai
(74) *Attorney, Agent, or Firm*—J. C. Patents

(57) ABSTRACT

A method of increasing the operating speed of an SRAM device. The SRAM device is constructed from a plurality of loads and a plurality of NMOS transistors. A positive voltage is applied to the substrate of the NMOS transistors when data needs to be read from the SRAM device or written to the SRAM device. The positive voltage increases the channel width between the source and the drain terminal of the NMOS transistors so that a higher current is produced and operating speed of the device is increased. An earth voltage is applied to the substrate when the SRAM device is in a standby mode to prevent current leakage.

6 Claims, 2 Drawing Sheets

METHOD OF INCREASING OPERATING SPEED OF SRAM

BACKGROUND OF THE INVENTION

1. Field of Invention

The present invention relates to a random access memory. More particularly, the present invention relates to a method of increasing the operating speed of a static random access memory (SRAM).

2. Description of Related Art

Random access memory is a type of volatile memory. There are two major types of volatile memories, namely, static random access memory (SRAM) and dynamic random access memory (DRAM). Digital data is stored as conductive states of the transistor inside a SRAM memory cell. On the other hand, digital data is stored as a charging state of a capacitor inside a DRAM.

Both SRAM and DRAM, however, will lose the stored data once power is cut off FIG. 1 is an equivalent circuit diagram of a conventional SRAM. As shown in FIG. 1, an SRAM has four NMOS transistors 10, 12, 14 and 16, and a pair of loads 18 and 20. The loads 18 and 20 can be resistors, PMOS transistors or depletion NMOS transistors. The NMOS transistors 10 and 12 serve as drivers while the NMOS transistors 14 and 16 serveas SRAM data holders. The gate terminal of both NMOS transistor 14 and 16 is connected to a word line. The drain terminal of the NMOS transistors 14 and 16 is connected to the gate terminal of the NMOS transistors 12 and 10 respectively. Therefore, the switching of the NMOS transistors 10 and 12 and the switching states of the NMOS transistors 14 and 16 are closely related. The source terminals of NMOS transistors 14 and 16 are connected to bit lines BL and BLB. In addition, the substrate terminals of all four NMOS transistors 10, 12, 14 and 16 are connected to an earth voltage terminal.

Since SRAM is a fast-operating memory device, any further increase in executing speed can improve overall operating characteristics of a computer system. However, the substrate terminals of all four NMOS transistors 10, 12, 14 and 16 are connected to an earth voltage terminal, leading to a narrowing of the channel between the source/drain terminals. A narrowed channel restricts current flow during any read/write operation and leads to a considerable drop in performance.

SUMMARY OF THE INVENTION

Accordingly, one object of the present invention is to provide a method of increasing the operating speed of SRAM. A voltage is applied to the substrate of component NMOS transistors to increase channel width between the source/drain terminals so that a faster operating speed is obtained during read/write operations while leakage current is lowered during standby.

To achieve these and other advantages and in accordance with the purpose of the invention, as embodied and broadly described herein, the invention provides a method of increasing the operating speed of a SRAM device. The SRAM is constructed using a plurality of loads and a plurality of NMOS transistors. To read data from the SRAM device, the substrate terminal of the NMOS transistors is connected to a first positive voltage. To write data into the SRAM device, the substrate terminal of the NMOS transistors is connected to a second positive voltage. When the SRAM device is in standby mode, the substrate terminal of the NMOS transistors is connected to an earth voltage.

The range of the first positive voltage and the second positive voltage is smaller than 0.5V. The substrate of the NMOS transistors can be P-type substrate. The loads can be resistors, PMOS transistors or depletion NMOS transistors.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
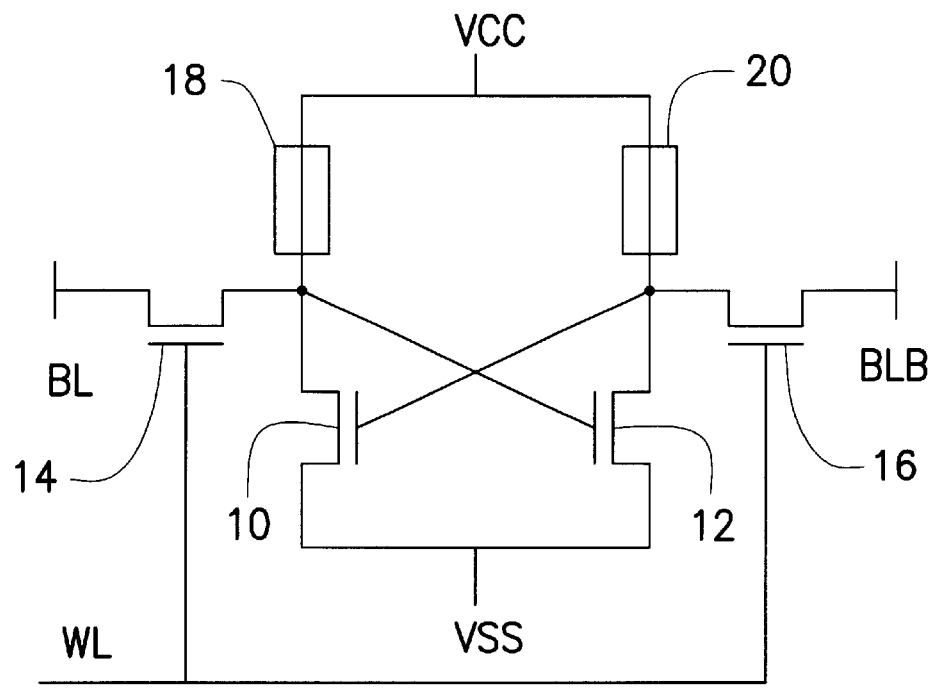
FIG. 1 is an equivalent circuit diagram of a conventional SRAM.

Reference will now be made in detail to the present preferred embodiments of the invention, examples of which are illustrated in the accompanying drawings. Wherever possible, the same reference numbers are used in the drawings and the description to refer to the same or like parts.

Figure 2:
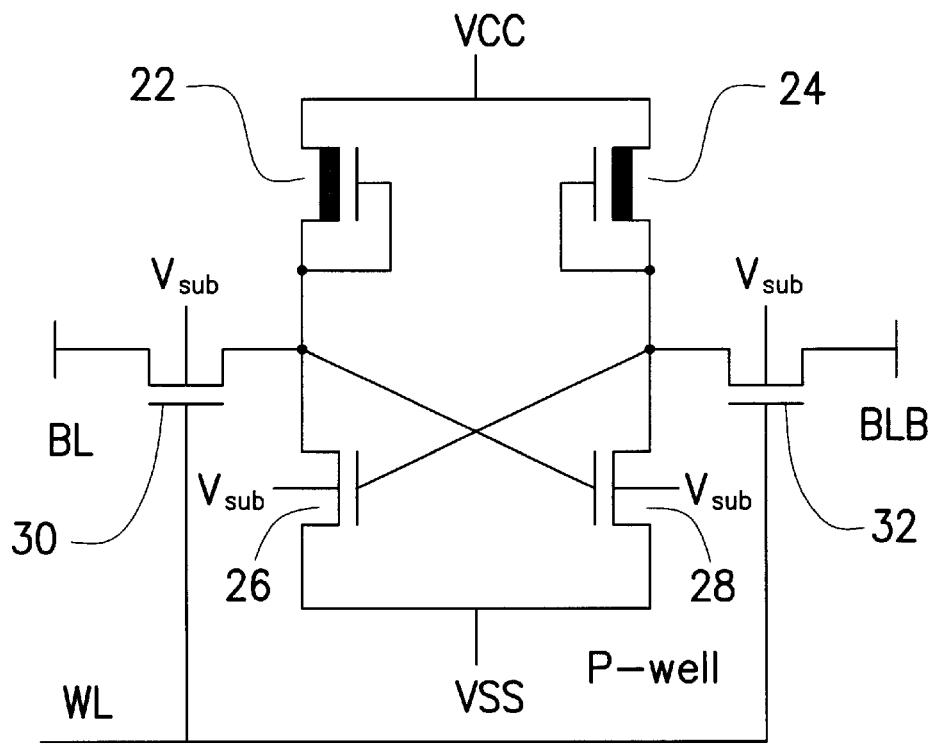
FIG. 2 is an equivalent circuit diagram of an SRAM device capable of providing a higher operating speed according to a first embodiment of this invention.

FIG. 2 is an equivalent circuit diagram of an SRAM device capable of providing a higher operating speed according to a first embodiment of this invention.

As shown in FIG. 2, the SRAM has a first load 22, a second load 24, a first NMOS transistor 26, a second NMOS transistor 28, a third NMOS transistor 30 and a fourth NMOS transistor 32. The first load 22 and the second load 24 can be resistors or depletion NMOS transistors as shown in FIG. 2. The drain terminal of the depletion NMOS transistors 22 and 24 is connected to a common high voltage Vcc. The gate terminal and source terminal of the depletion transistor 22 as well as the gate terminal and source terminal of the depletion transistor 24 are connected together to form nodes N1 and N2 respectively. The NMOS transistors 26, 28, 30 and 32 are enhancement NMOS transistors.

The node N1 of the depletion NMOS transistor 22 is connected to the drain terminal of the first NMOS transistor 26, the gate terminal of the second NMOS transistor 28 and the drain terminal of the third NMOS transistor 30. The node N2 of the depletion NMOS transistor 24 is connected to the drain terminal of the second NMOS transistor 28, the gate terminal of the first NMOS transistor 26 and the drain terminal of the fourth NMOS transistor 32. The source terminals of the first NMOS transistor 26 and the second NMOS transistor 28 are connected to a common earth voltage Vss. The gate terminals of the third NMOS transistor 30 and the fourth NMOS transistor 32 are connected to a word line (WL). The source terminals of the third NMOS transistor 30 and the fourth NMOS transistor 32 are connected to a first bit line BL and a second bit line BLB respectively.

Figure 3:
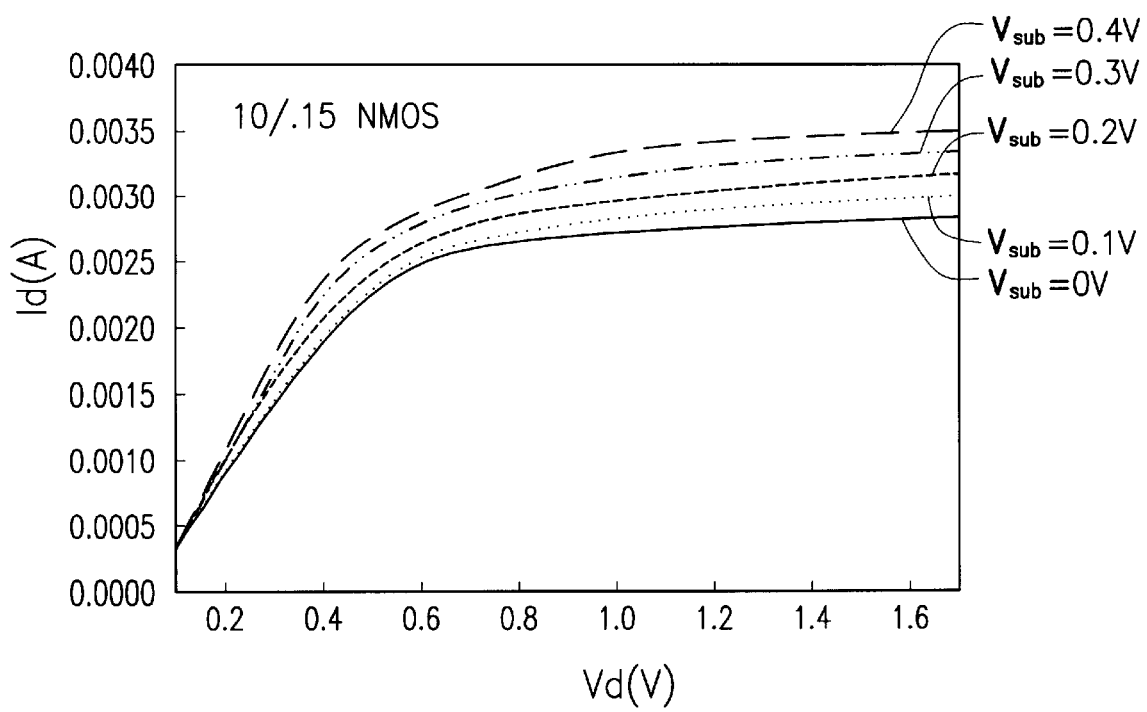
FIG. 3 is a graph showing current versus voltage characteristic for various applied voltages to the substrate of a transistor.

One major aspect in the operation of the SRAM device of this invention is that the substrates of all four NMOS transistors 26, 28, 30 and 32 are connected to a controllable substrate voltage Vsub. To write data into the SRAM or read data from the SRAM, a voltage greater than 0V but smaller than 0.5V is applied to the substrate of the NMOS transistors (26, 28, 30 and 32). Hence, the channel width between the source/drain terminals in each of the NMOS transistors will be increased leading to a larger flow current and resulting in a higher SRAM executing speed. FIG. 3 is a graph showing current versus voltage characteristic for various applied voltages to the substrate of a transistor. As shown in FIG. 3, increasing the substrate voltage (for example, the uppermost curves refers to the application of a substrate voltage 0.4V) generates a larger channel current. On the other hand, when the SRAM is in a standby mode, an earth voltage is applied to the respective substrate terminals of the NMOS transistors 26, 28, 30 and 30 to limit leakage current. All four NMOS transistors 26, 28, 30 and 32 can be designed on the same P-well or P-type substrate.

Figure 4:
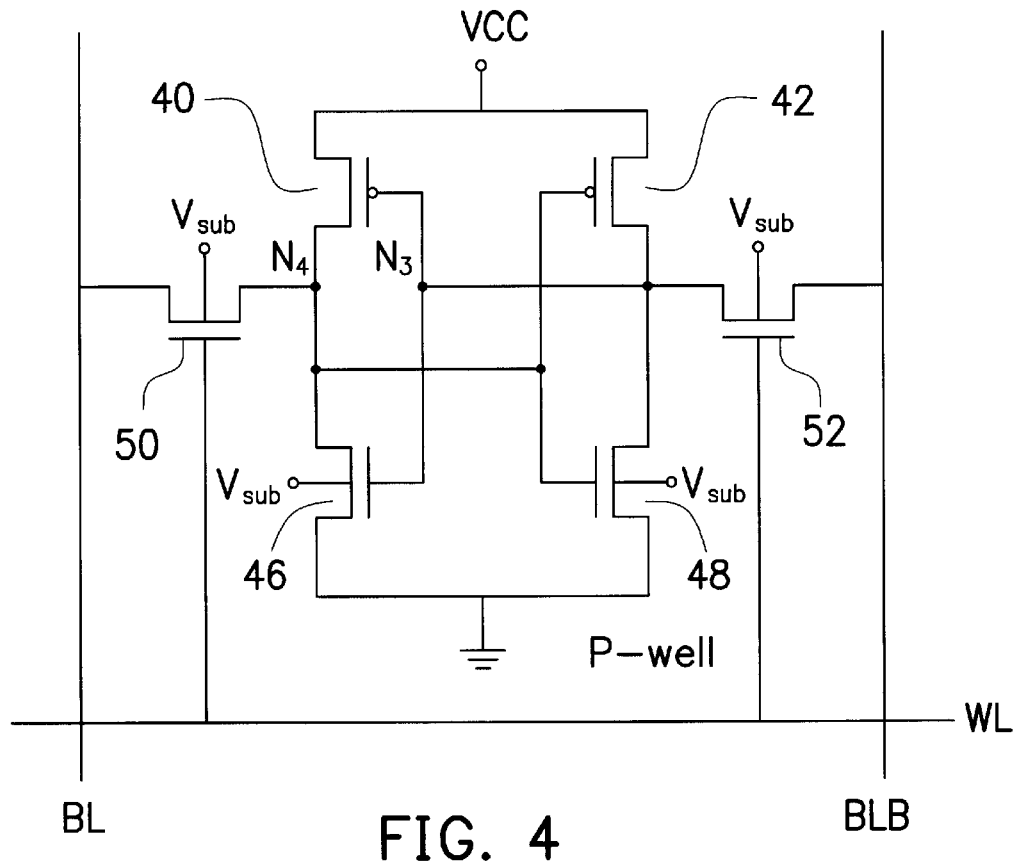
FIG. 4 is an equivalent circuit diagram of an SRAM device capable of providing a higher operating speed according to a second embodiment of this invention.

FIG. 4 is an equivalent circuit diagram of an SRAM device capable of providing a higher operating speed according to a second embodiment of this invention. In FIG. 4, the depletion NMOS transistors 22 and 24 in FIG. 2 have been replaced by PMOS transistors 40 and 42. The source terminal of the first PMOS transistor 40 and the second PMOS transistor 42 are connected to a common high voltage Vcc. The gate terminal N3 of the first PMOS transistor 40 is connected to the gate terminal of the first NMOS transistor 46, the drain terminal of the second PMOS transistor 42, the drain terminal of the second NMOS transistor 48 and the drain terminal of the fourth NMOS transistor 52. The drain terminal N4 of the first PMOS transistor 40 is connected to the drain terminal of the first NMOS transistor 46, the gate terminal of the second PMOS transistor 42, the gate terminal of the second NMOS transistor 48 and the drain terminal of the third NMOS transistor 50. The gate terminal of the third NMOS transistor 50 and the fourth NMOS transistor 52 is connected to a common word line (WL). The source terminal of the third NMOS transistor 50 and the fourth NMOS transistor 52 is connected to a first bit line BL and a second bit line BLB respectively.

Operation of the circuit in the second embodiment of this invention is similar to that described in the first embodiment of this invention. To read data from the SRAM device or write data to the SRAM device, a positive voltage is applied to the substrate terminal of the NMOS transistors 46, 48, 50 and 52. In the standby mode, all the NMOS substrate terminals are connected to an earth voltage. Hence, channel width between the source and the drain terminals of the NMOS transistors will increase leading to a higher current flow and a faster-operating SRAM while leakage current will decrease in the standby mode.

In summary, this invention increases the operating speed of an SRAM device. A different voltage is applied to the substrate of SRAM transistors according to whether the SRAM device is in a reading, writing or a standby mode, hence the SRAM device can work faster and produce a smaller current leak.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of increasing the operating speed of a static random access memory (SRAM) device, wherein the SRAM device is constructed from a plurality of loads and a plurality of NMOS transistors, comprising the steps of:

applying a first positive voltage to the substrate of the NMOS transistors when data is read from the SRAM device;

applying a second positive voltage to the substrate of the NMOS transistors when data is written into the SRAM device; and applying an earth voltage to the substrate of the NMOS transistor when the SRAM device is in a standby mode.

2. The method of claim 1, wherein the first positive and the second positive voltage is smaller than 0.5V.

3. The method of claim 1, wherein the substrate of the NMOS transistors is P-type substrate.

4. The method of claim 1, wherein the loads are resistors.

5. The method of claim 1, wherein the loads are PMOS transistors.

6. The method of claim 1, wherein the loads are depletion NMOS transistors and the NMOS transistors are enhancement NMOS transistors.

* * * * *